United States Patent [19]

Duhl et al.

[11] 4,209,348

[45] Jun. 24, 1980

[54] HEAT TREATED SUPERALLOY SINGLE CRYSTAL ARTICLE AND PROCESS

[75] Inventors: David N. Duhl, Newington; Walter E. Olson, Vernon, both of Conn.

[73] Assignee: United Technologies Corporation, Hartford, Conn.

[21] Appl. No.: 970,710

[22] Filed: Dec. 18, 1978

Related U.S. Application Data

[63] Continuation-in-part of Ser. No. 800,505, May 25, 1977, abandoned, which is a continuation-in-part of Ser. No. 742,967, Nov. 17, 1976, Pat. No. 4,116,723.

[51] Int. Cl.² .............................................. C22F 1/10
[52] U.S. Cl. .......................................... 148/3; 75/171; 148/32; 148/32.5; 148/162
[58] Field of Search ................... 148/32, 32.5, 3, 162; 75/171, 170

[56] References Cited

U.S. PATENT DOCUMENTS 3,494,709   2/1970   Plearcey .............................. 75/171

*Primary Examiner*—R. Dean
*Attorney, Agent, or Firm*—Charles E. Sohl

[57] ABSTRACT

Nickel base superalloy single crystal articles formed of a particular compositon and heat treated are described as is the process employed. The resultant articles are substantially free from the grain boundary strengtheners such as carbon, boron, and zirconium and contain only a limited amount of cobalt. As a result of the alloy composition, the alloys have a high incipient melting temperature. The heat treatment process homogenizes the micro-structure, and refines the gamma prime morphology.

9 Claims, No Drawings

HEAT TREATED SUPERALLOY SINGLE CRYSTAL ARTICLE AND PROCESS

CROSS REFERENCE TO RELATED APPLICATIONS

This application is a continuation-in-part of U.S. Ser. No. 800,505 filed May 25, 1977, abandoned which is in turn a continuation-in-part of Ser. No. 742,967, filed Nov. 17, 1976 now U.S. Pat. No. 4,116,723.

BACKGROUND OF THE INVENTION

1. Field of the Invention

This invention relates to the field of homogeneous single crystal superalloy articles.

2. Description of the Prior Art

The nickel base super-alloy art area has been extensively investigated for many years, and as a result there are very many issued patents in this area. Some of these disclose alloys in which no intentional additions of cobalt, carbon, boron, or zirconium are made, or alloys in which these elements are optional. These include, for example, U.S. Pat. Nos. 2,621,122; 2,781,264; 2,912,323; 2,994,605; 3,046,108; 3,166,412; 3,188,402; 3,287,110; 3,304,176 and 3,322,534. These patents do not discuss single crystal applications.

U.S. Pat. No. 3,494,709, assigned to the assignee of the present invention, discloses the use of single crystal articles in gas turbine engines. This patent discusses the desirability of limiting certain elements such as boron and zirconium to low levels.

The limitation of carbon to low levels in single crystal superalloy articles is discussed in U.S. Pat. No. 3,567,526 which is also assigned to the present assignee.

U.S. Pat. No. 3,915,761, assigned to the present assignee discloses a nickel base superalloy article produced by a method which provides a hyperfine dendritic structure. As a result of the fineness of the structure, the article may be homogenized in relatively short times.

The conventional nickel base superalloys which are used to fabricate such parts have evolved over the last 30 years. Typically these alloys contain chromium in levels of about 10% primarily for oxidation resistance, aluminum and titanium in combined levels of about 5% for the formation of the strengthening gamma prime phase and refractory metals such as tungsten, molybdenum, tantalum and columbium in levels of about 5% as solid solution strengtheners. Virtually all nickel base superalloys also contain carbon in levels of about 0.1% which acts as a grain boundary strengthener and forms carbides which strengthen the alloy. Boron and zirconium are also often added in small amounts as grain boundary strengtheners.

Most commonly, gas turbine blades are formed by casting and the casting process most often utilized produces parts having equiaxed nonoriented grains. It is well known that the high temperature properties of metals are usually quite dependent upon grain boundary properties, consequently efforts have been made to strengthen such boundaries (for example by the additions discussed previously), or to reduce or eliminate the grain boundaries transverse to the major stress axis of the part. One method of eliminating such transverse boundaries is termed directional solidification and is described in U.S. Pat. No. 3,260,505. The effect of directional solidification is to produce an oriented microstructure of columnar grains whose major axis is parallel to the stress axis of the part and which has minimal or no grain boundaries perpendicular to the stress axis of the part. A further extension of this concept is the utilization of single crystal parts in gas turbine blades. This concept is described in U.S. Pat. No. 3,494,709. The obvious advantage of the single crystal blade is the complete absence of grain boundaries. In single crystals, therefore, grain boundaries are eliminated as potential weaknesses, hence, the mechanical properties of the single crystal are completely dependent upon the inherent mechanical properties of the material.

In the prior art alloy development much effort was devoted to the solution of the problems resulting from grain boundaries, through the addition of elements such as carbon, boron, and zirconium. Another problem which prior art alloy development sought to avoid was the development of deleterious phases after long term exposures at elevated temperatures (i.e. alloy instability). These phases are of two general types. One, such as sigma, is undesirable because of its brittle nature while the other, such as mu, is undesirable because the phase ties up large amounts of the refractory solid solution strengtheners thus weakening the remaining alloy phases. These phases are termed TCP phases for topologically closed packed phases, and one of their common properties is that they all contain cobalt. There are TCP phases which can form in the absence of cobalt but these cobalt free TCP phases contain other elements such as silicon which are not commonly found in nickel base superalloys. While an obvious remedy to control these deleterious phases is the removal or minimization of cobalt, this has not proved practical in prior art alloys for polycrystalline applications. The problem is that if the cobalt is removed or significantly reduced, the carbon combines preferentially with the refractory metals to form $M_6C$ carbides which are deleterious to the properties of the material as their formation depletes the alloy of the strengthening refractory elements.

U.S. Pat. No. 3,567,526 teaches that carbon can be completely removed from single crystal superalloy articles and that such removal improves fatigue properties.

In single crystal articles which are free from carbon there are two important strengthening mechanisms. The most important strengthening mechanism is the intermetallic gamma prime phase, $Ni_3(Al, Ti)$. In modern nickel base superalloys the gamma prime phase may occur in quantities as great as 60 volume percent. The second strengthening mechanism is the solid solution strengthening which is produced by the presence of the refractory metals such as tungsten and molybdenum in the nickel solid solution matrix. For a constant volume fraction of gamma prime, considerable variations in the strengthening effect of this volume fraction of gamma prime may be obtained by varying the size and morphology of the gamma prime precipitate particles. The gamma prime phase is characterized by having a solvus temperature above which the phase dissolves into the matrix. In many cast alloys, however, the gamma prime solvus temperature is in fact above the incipient melting temperature so that it is not possible to effectively solutionize the gamma prime phase without incipient melting. Solutionizing of the gamma prime is the only way in which the morphology of the as cast gamma prime phase can be modified, hence for many modern commercial nickel base superalloys the gamma prime morphology is limited to the morphology which resulted from the original casting process. The other strengthening mechanism, solid solution strengthening, is most effective when the solid solution strengthening elements are uniformly distributed throughout the nickel solid solution matrix. Again this strengthening is reduced in effectiveness because of the nature of the casting and solidification process. Practical nickel base superalloys freeze over a wide temperature range. The freezing or solidification process involves the formation of high melting point dendrites followed by the subsequent freezing of the lower temperature melting interdendritic liquid. This solidification process leads to significant compositional inhomogeneities throughout the microstructure. It is theoretically possible to homogenize such a microstructure by heating at elevated temperatures to permit diffusion to occur, however, in practical nickel base superalloys the maximum homogenization temperature, which is limited by the incipient melting temperature, is too low to permit significant homogenization in practical time intervals.

SUMMARY OF THE INVENTION

This invention includes three interrelated aspects. The first aspect is the particular alloy employed. The alloy is a nickel base alloy containing from about 8 to about 12% chromium, from about 4.5 to about 5.5% aluminum, from about 1 to 2% titanium, from 3 to 5% tungsten, and from 10 to 14% tantalum. The cobalt content is controlled to fall within the range of 3–7%, and the balance is essentially nickel. The alloy employed in the present invention is free from intentional additions of carbon, boron and zirconium, although obviously these elements may be present as unintentional impurities. The alloy is characterized by having an incipient melting temperature in excess of about 2300° F. Thus, this alloy may be heat treated under conditions which permit solutionizing of the gamma prime phase without incipient melting. At the same time the high incipient melting temperature permits essentially complete homogenization of the alloy in commercially practicable times. The high incipient melting temperature of the alloy is a result of the absence of carbon, boron and zirconium. The low cobalt content inhibits the formation of deleterious TCP phases.

The second important aspect of the invention is the formation of the previously described alloy into single crystal articles.

The third aspect of the invention is the heat treatment sequence by which the gamma prime morphology may be modified and refined at the same time that significant homogenization of the as cast microstructure is performed. The resultant single crystal article will have a microstructure whose typical gamma prime particle size is about one third of the gamma prime particle size found in the as cast material. At the same time the heat treated single crystal microstructure will be essentially free from compositional inhomogeneities and this uniform microstructure combined with the increased gamma prime solvus temperature will permit the article of the present invention to exhibit temperature capabilities, for equal mechanical properties, which are at least 30° F. greater than the temperature capabilities of comparable prior art single crystal articles which are formed from conventional alloys containing carbon, boron and zirconium and conventional levels of cobalt. The alloys have advantages over conventional alloys even if not heat treated, but the heat treatment is the preferred embodiment.

The foregoing, and other objects, features and advantages of the present invention will become more apparent in light of the following detailed description of the preferred embodiment thereof.

DESCRIPTION OF THE PREFERRED EMBODIMENTS

In the description which follows, all percent figures are in weight percent unless otherwise specified.

This invention relates to an article made of a specific alloy by a critical series of process steps. Although other articles may be produced according to this invention, this invention has particular utility in the fabrication of airfoils (blades and vanes) for use in gas turbine engines. In particular, the high strength of articles made according to this invention make them especially suited for use as blades in gas turbine engines.

A primary feature in the alloys employed in the present invention is the substantial elimination of the grain boundary strengthening agents, carbon, boron and zirconium and the reduction in cobalt content relative to conventional superalloys. The alloys of the invention are intended for use as gas turbine components in a single crystal form. No intentional additions of the elements, carbon, boron and zirconium are made, however, some will invariably be present as an impurity.

In order to ensure that TCP phases will not form in the alloy over a wide range of compositions and operating conditions, the level of cobalt is controlled to fall within the range of 3 to 7%.

Likewise, with regard to the grain boundary strengthening agents carbon, boron and zirconium, no intentional additions are made. If the maximum benefit is to be obtained from this invention, no single element of the group carbon, boron and zirconium should be present in an amount greater than 50 ppm and it is preferred that the total of such impurities be less than 100 ppm. Most preferably carbon is present in an amount less than 30 ppm and the remaining elements are each present in quantities less than 20 ppm. In any event, the carbon level must be restricted to be below that amount of carbon which will form MC type carbides. It must be emphasized that no intentional addition of these elements is contemplated and that their presence in the alloy or single crystal article of the invention is unintentional and undesirable.

Alloys which can be produced using the concept of the present invention will contain:

(1) from 8 to 12% chromium,
(2) from 4.5 to 5.5% aluminum, and from 1–2% titanium,
(3) from 3–5% tungsten and from 10–14% tantalum,
(4) from 3–7% cobalt,
(5) balance essentially nickel.

Within the preceding ranges, certain relationships are preferred. The sum of tungsten and tantalum levels is preferably at least 15.5% to insure adequate solid solution strengthening and improved elevated temperature creep strength. A tantalum level of at least 11% is preferred for oxidation resistance. The elements aluminum, titanium and tantalum participate in the formation of the gamma prime phase (Ni$_3$Al, Ti, Ta) and for maximum strengthening by the gamma prime phase the total content of aluminum plus titanium plus tantalum is preferably at least 17.5%. Aluminum and titanium are the principal elements which form the gamma prime phase and the ratio of aluminum to titanium must be controlled to be greater than 2.5 and preferably greater than 3.0 to insure adequate oxidation resistance. At least 9% chromium should be present if the article is to be used in environments where sulfidation is a problem. The minor addition of cobalt also aids in improving sulfidation resistance.

Alloys made according to the preceding limitations will comprise a nickel chromium solid solution containing at least 30% by volume of the ordered phase of the composition Ni₃M where M is aluminum, titanium, tantalum, and tungsten to a lesser degree.

The alloys within the ranges set forth above are thermally stable and deleterious microstructural instabilities such as the cobalt containing TCP phases will not form, even after extended exposure at elevated temperature as for example 500 hours at either 1600°, 1800° or 2000° F. Further, the alloys have good fatigue properties since the formation of deleterious carbide particles is prevented. The refractory metals which would normally combine with carbon or precipitate in TCP phase formation remain in solid solution and result in an alloy having exceptional mechanical properties.

An important benefit which arises from the elimination of boron, carbon and zirconium is an increase in the incipient melting temperature. Typically the incipient melting temperature of the present alloys, that temperature at which the alloy first begins localized melting, will be increased by at least 50° F. over the incipient melting temperature of a similar (prior art) alloy which contains normal amounts of carbon, boron and zirconium. The incipient melting temperature of the alloy of this invention will typically exceed 2300° F. while conventional high strength, high volume fraction gamma-gamma prime alloys typically have incipient melting temperatures below 2300° F. This increased temperature permits solutionizing heat treatments to be performed at temperatures where complete solutionizing of the precipitated gamma prime is possible while simultaneously permitting a significant amount of homogenization within reasonable times.

The alloys of the present invention will not form the carbides which have been found necessary for grain boundary strengthening in polycrystalline nickel base superalloys. For this reason the alloys of the present invention must be used as single crystal articles. The formation of the alloy into single crystal form is a critical aspect of the present invention, but the method of single crystal formation is unimportant. Typical articles and solidification techniques are described in U.S. Pat. No. 3,494,709 to Piearcey, which is assigned to the assignee of the present application, and the contents of this patent are incorporated herein by reference.

The final aspect of the invention involves the specific heat treatment applied to the single crystal article. The as cast single crystal article will contain the gamma prime phase in dispersed form with a typical particle size on the order of 1.5 microns. The gamma prime solvus of the alloy will typically fall in the range of 2350°–2400° F. and the incipient melting temperature will be in excess of about 2350° F. Thus, heat treatment in the range of 2350°–2400° F. (but below the incipient melting temperature) will place the precipitated gamma prime phase into solution without deleterious localized melting. Times on the order of ½ to 8 hours will normally be satisfactory although longer times may be employed. Such heat treatment temperatures are about 100° F. higher than those which can be employed with polycrystalline articles of conventional superalloys. This elevated temperature permits a substantial amount of homogenization to occur during the solutionizing steps.

Following the solutionizing treatment, an aging treatment at 1600°–2000° F. may be utilized to reprecipitate the gamma prime in refined form. Typical gamma prime particle sizes after reprecipitation will be less than about 0.5 micron.

The preceding discussion of the preferred embodiment will be clarified through reference to the following illustrative examples:

EXAMPLE 1

Alloys having compositions set forth in Table I were prepared.

TABLE I

|  | Cr | W | Ta | Al | Ti | Co | Hf | C | B | Cb | Mo | Zr |
|---|---|---|---|---|---|---|---|---|---|---|---|---|
| Alloy 444 (a) | 9 | 12 | — | 5 | 2.0 | — | — | — | — | — | — | — |
| Alloy 454 (a) | 10 | 4 | 12 | 5 | 1.5 | 5 | — | — | — | — | — | — |
| Alloy PWA 1409 (a) | 9 | 12.5 | — | 5 | 2.0 | 10 | — | .15 | .015 | 1.0 | — | .05 |
| Alloy PWA 1422 (b) | 9 | 12.0 | — | 5 | 2.0 | 10 | 2.0 | .11 | .015 | 1.0 | — | .10 |
| Alloy PWA 1455 (c) | 8 | — | 4.3 | 6 | 1.0 | 10 | 1.15 | .11 | .015 | — | 6 | .07 |
| Alloy PWA 1481 (a) | 10 | 6 | 8 | 6 | 1.0 | — | — | — | — | — | — | — |
| Alloy SM 200 (b,c,d) | 9 | 12.5 | — | 5 | 2.0 | 10 | — | .15 | .015 | 1.0 | — | .05 |
| Alloy SM 200 (a,d) (No B, No Zr) | 8.4 | 12.35 | — | 5.2 | 2.2 | 9.65 | — | .10 | <.001 | 1.1 | — | <.001 |

(Balance Nickel)

(a) Single crystal form
(b) Columnar grains
(c) Equiaxed grains
(d) Shown in U.S. Pat. No. 3,494,709

Alloy 444 is disclosed in U.S. Ser. No. 742,967, the parent case of the present application. Alloy 454 is the alloy of the present invention. Both of these alloys were solidified in single crystal form. Alloy PWA 1422 is a commercial alloy used as a blade material in gas turbine engines and noted for its high temperature mechanical properties. Alloy PWA 1422 was produced in a directionally solidified form having elongated columnar grains. Alloy 1455 is a commercial alloy which has been used as a gas turbine blade material. It is noted for its high temperature oxidation resistance. This alloy was produced by conventional casting methods with equiaxed nonoriented grains. Alloy PWA 1481 is a previously developed single crystal alloy developed to have good oxidation/corrosion behavior in combination with reasonable mechanical properties.

It can be seen that SM 200, SM 200 (No B, Zr), PWA 1409 and PWA 1422 have similar compositions. SM 200 represents the original alloy composition and is used in either equiaxed or directionally solidified columnar grained form. SM 200 (No B, Zr) represents a modification in which B and Zr are deleted. These elements primarily affect grain boundaries and this modified composition is intended for single crystal applications where grain boundary strength is not a consideration.

Alloy PWA 1422 is alloy SM 200 with additions of Hf for improved transverse ductility. PWA 1422 is used in directionally solidified columnar grained form. Alloy PWA 1409 is another composition which is used in single crystal form. Except for its intended form, it is quite similar to SM 200.

The experimental alloys (alloys 444 and 454) were heat treated according to the invention, the treatment used was a 4 hour solution heat treatment at 2350° F. with subsequent aging treatments at 1975° F. for 4 hours and 1600° F. for 32 hours. Alloys PWA 1409 and 1422 were treated at 2200° F. for 2 hours followed by aging treatments at 1975° F. for 4 hours and 1600° F. for 32 hours and the alloy PWA 1455 was tested as cast. The prior art alloys were heat treated according to the usual commercial practice. The SM 200 samples were heat treated at 2250° F. for 1 hour and then at 1600° F. for 32 hours.

EXAMPLE 2

Some of the alloy samples produced in Example 1 were tested to evaluate their creep rupture properties. The test conditions and results are set forth below in Table II.

TABLE II

| ALLOY | TEST CONDITIONS | TIME TO 1% CREEP | RUPTURE LIFE | % ELONGATION |
|---|---|---|---|---|
| SM 200 | 1400° F./95 ksi | — | 728.4 | 12.2 |
| Alloy 454 | 1400° F./95 ksi | — | 1200* | 9.0* |
| Alloy 454 | 1400° F./110 ksi | — | 475 | 8.8 |
| Alloy 444 | 1700° F./50 ksi | 28.5 | 82.6 | — |
| Alloy 454 | 1700° F./50 ksi | 46.2 | 165.6 | — |
| PWA 1422 | 1700° F./50 ksi | 17 | 76 | — |
| Alloy 444 | 1800° F./29 ksi | 110 | 310 | — |
| Alloy 454 | 1800° F./29 ksi | 143.9 | 350 | — |
| PWA 1422 | 1800° F./29 ksi | 60 | 160 | — |
| Alloy 454 | 1800° F./30 ksi | — | 240* | 12.0* |
| SM 200 | 1800° F./30 ksi | — | 124.5 | 24.9 |
| SM 200 (No B, Zr) | 1800° F./30 ksi | — | 191.5 | 12.8 |

*Extrapolated value

Referring to Table II, it is apparent that under the test conditions employed, the invention alloy (454) was superior to the other alloys tested including SM 200, SM 200 (No B, Zr), 444 and PWA 1422. The proportionate degree of superiority of the invention alloy, in time to 1% creep, to alloy 444 can be seen to diminish somewhat with increasing temperature. However, in creep, the superiority of the invention alloy to the commercial alloy, 1422, can be seen to increase significantly with increasing test temperature.

In terms of rupture life, the superiority of the invention alloy to the 1422 alloy is seen to increase with increasing temperature. The invention alloy displays properties superior to those of the other alloys under all conditions tested. Since the trend in gas turbine engines is toward increased efficiency through higher temperature, the improved elevated temperature properties of the present invention are significant.

EXAMPLE 3

Samples of some of the materials described in Example 1 were tested for resistance to sulfidation and oxidation at elevated temperatures. The sulfidation test involved the application of $Na_2SO_4$ at the rate of 1 mg/cm$^2$ every twenty hours. The failure criteria was a weight loss of 250 mg/cm$^2$ or more. The oxidation tests were performed both on the unprotected alloys at 2100° F. under cyclic conditions and on the alloys protected with a NiCoCrAlY type of coating under cyclic conditions at 2150° F. NiCoCrAlY is a commercial coating material having a nominal composition of 18% Cr, 23% Co, 12.5% Al, 0.3% Y, balance nickel. The tests on coated samples were normalized to minimize the effect of different coating thicknesses. This coating is described in U.S. Pat. No. 3,928,026 which is incorporated herein by reference. The tests of coated samples are significant since these alloys are always used in a coated condition and since coating substrate interactions occur in-service. The test results are shown below in Table III.

TABLE III

Sulfidation and Oxidation Data

| Alloy | 1650° F. Furnace Sulfidation (Hours to Failure) | 2100° F. Uncoated Oxidation Resistance (mils of attack in 200 hours) | 2150° F. Cyclic Burner Rig NiCoCrAly Coated (hours to failure per mil of coating) |
|---|---|---|---|
| 454 | 313 | 7 | 160 |
| 444 | 178 | N.A. | 90.0 |
| PWA 1455 | 42 | 8 | 102.5 |
| PWA 1422 | 178 | 24* | 50 |

*Measured after 143 hours.

The sulfidation resistance of the invention alloy is clearly superior to that of the other alloys tested. Likewise, in cyclic oxidation evaluation of uncoated samples, the invention alloy outperforms even alloy 1455, an alloy noted for inherent oxidation resistance. Even when a protective coating is employed, the invention alloy displays superior resistance to elevated temperature cyclic oxidation.

EXAMPLE 4

Tensile tests were conducted on alloys 454, SM 200, and PWA 1481 at room temperature and 1100° F. The results are shown below.

TABLE IV

| Alloy | Temperature | .2% YS (Ksi) | UTS (Ksi) | % Elong. |
|---|---|---|---|---|
| SM 200 | 10 70° F. | 149.3 | 150.6 | 2.3 |
| SM 200 (No B, Zr) | 70° F. | 152.6 | 154.7 | 4.0 |
| 454 | 70° F. | 168.5 | 197.4 | 8.7 |
| 1409 | 1100° F. | 140 | 165 | — |
| 1481 | 1100° F. | 157 | 203 | — |
| 454 | 1100° F. | 172 | 206 | — |

Again the marked superiority of the invention alloy, 454 is evident. The yield strength improvements are believed to be related in general to the Ta level. Alloys SM 200/1409, 1481, and 454 contain 0, 8, and 12% Ta respectively and the high Ta content of the invention alloy is believed largely responsible for its superior tensile properties.

Although the invention has been shown and described with respect to a preferred embodiment thereof, it should be understood by those skilled in the art that various changes and omissions in the form and detail thereof may be made therein without departing from the spirit and scope of the invention.

Having thus described a typical embodiment of our invention, that which we claim as new and desire to secure by Letters Patent of the United States is:

1. A heat treated nickel base single crystal superalloy article suited for use at elevated temperatures having a composition consisting essentially of:
   a. from about 8 to about 12% chromium,
   b. from about 4.5 to about 5.5% aluminum,
   c. from about 1 to about 2% titanium,
   d. from about 3 to about 5% tungsten,
   e. from about 10 to about 14% tantalum,
   f. from about 3 to about 7% cobalt,
   g. balance essentially nickel, said article being free from intentional additions of carbon, boron and zirconium, and said article being free from internal grain boundaries and having an average gamma prime particle size of less than about 0.5 micron and an incipient melting temperature in excess of about 2350° F.

2. An article as in claim 1 wherein the sum of the tungsten and tantalum contents are at least about 15.5%.

3. An article as in claim 1 wherein the tantalum content is at least about 11%.

4. An article as in claim 1 wherein the sum of the aluminum, titanium, and tantalum contents are at least 17.5%.

5. An article as in claim 1 wherein the ratio of aluminum to titanium is greater than about 2.5.

6. An article as in claim 1 wherein the ratio of aluminum to titanium is greater than about 3.0.

7. An article as in claim 1 wherein the chromium content exceeds about 9%.

8. A method for producing a single crystal nickel base superalloy article suited for use at elevated temperatures including the steps of:

a. providing an alloy consisting essentially of from about 8 to about 12% chromium, from about 4.5 to about 5.5% aluminum, from about 1 to about 2% titanium, from about 3 to about 5% tungsten, from about 10 to about 14% tantalum, from about 3 to about 7% cobalt, balance essentially nickel, said alloy being free from intential additions of carbon, boron and zirconium,
   b. forming the alloy into a single crystal article, and
   c. solution heat treating the article at a temperature of from about 2350° to about 2400° F., but below the incipient melting temperature so as to place the gamma prime phase into solid solution, and
   d. aging the article at a temperature of from about 1600° to about 2000° F. to reprecipitate the gamma phase in a refined form.

9. An intermediate single crystal article useful in the production of articles for use at elevated temperatures, said intermediate article having a composition consisting essentially of:
   a. from about 8 to about 12% chromium,
   b. from about 4.5 to about 5.5% aluminum,
   c. from about 1 to about 2% titanium,
   d. from about 3 to about 5% tungsten,
   e. from about 10 to about 14% tantalum,
   f. from about 3 to about 7% cobalt,
   g. balance essentially nickel, said article being free from intentional additions of carbon, boron and zirconium, said article being free from internal grain boundaries and having an as cast microstructure and having an incipient melting temperature in excess of 2350° F.

* * * * *